United States Patent
Hannah (10) Patent No.: US 7,309,866 B2
(45) Date of Patent: Dec. 18, 2007

(54) COSMIC RAY DETECTORS FOR INTEGRATED CIRCUIT CHIPS

(75) Inventor: Eric C. Hannah, Pebble Beach, CA (US)

(73) Assignee: Intel Corporation, Santa Clara, CA (US)

( * ) Notice: Subject to any disclaimer, the term of this patent is extended or adjusted under 35 U.S.C. 154(b) by 507 days.

(21) Appl. No.: 10/882,917

(22) Filed: Jun. 30, 2004

(65) Prior Publication Data
US 2006/0000981 A1  Jan. 5, 2006

(51) Int. Cl.
*G01T 1/24* (2006.01)
(52) U.S. Cl. .................................. 250/370.14
(58) Field of Classification Search ............ 250/370.14
See application file for complete search history.

(56) References Cited

U.S. PATENT DOCUMENTS

| 3,896,309 A | 7/1975 | Halsor et al. |
| 4,199,810 A | 4/1980 | Gunckel et al. |
| 2003/0234430 A1* | 12/2003 | Friend et al. ............... 257/428 |

FOREIGN PATENT DOCUMENTS

JP  02245632  10/1990

OTHER PUBLICATIONS

Hammig, M D., "The design and construction of a mechanical radiation detector", *Nuclear Science Symposium 1998*, Conference record, 1998 IEEE Toronto, Ont., Canada Nov. 8-14, 1998, Piscataway, NJ, vol. 2,(Nov. 8, 1998),803-805
"PCT/US2005/023252 International Search Report and Written Opinion", (Nov. 23, 2006),15 pages, not a publication.
Ziegler, J.F. et al., IBM Experiments in Soft Fails in Computer Electronics, IBM Journal of Research and Development, vol. 40, No. 1, Jan. 1996, pp. 3-18.
High Energy Cosmic Rays, SLAC's Cosmic Ray Detector, Jul. 8, 2002 http://www2.slac.stanford.edu/vvc/cosmicrays/crslac.html 4 pages.
High Energy Cosmic Ray, Detector Parts, Jul. 8, 2002 http://www2.slac.stanford.edu/vvc/cosmicrays/ccrtparts.html#scintillator 3 pages.

* cited by examiner

*Primary Examiner*—Constantine Hannaher
(74) *Attorney, Agent, or Firm*—Alan K. Aldous (57) ABSTRACT

A cosmic ray detector includes a cantilever with a first tip. The detector also includes a second tip and circuitry to provide a signal indicative of a distance between the first and second tips being such as would be caused by a cosmic ray interaction event.

18 Claims, 10 Drawing Sheets

COSMIC RAY DETECTORS FOR INTEGRATED CIRCUIT CHIPS

RELATED APPLICATION

This application was filed the same day as an application entitled "System With Response to Cosmic Ray Detection" (application No. 10/882,898, now Patent 7,166,847) with the sane inventor. Other than the Related Application and Technical Field sections, the two applications have identical specifications and figures, but different claims.

BACKGROUND

1. Technical Field

The present inventions relate to cosmic detectors for integrated circuit chips.

2. Background Art

The normal background radiation environment on the surface of the earth has ionizing components that sometimes affects the reliability of semiconductor integrated circuit chips, such as memory chips used in computers. If an intruding particle is near a p-n junction in the chip, it may induce a soft error, or single-event upset which can cause signals to change voltage and, accordingly, bits of data to change voltage value. Excess electron-hole pairs may be generated in the wake of the penetrating particle. The field in the neighborhood of the p-n junction, if sufficiently strong, separates these electrons and holes before they recombine, and sweeps the excess carriers of the appropriate sign to a nearby device contact. A random signal may be registered if this collected charge exceeds a critical threshold value.

Cosmic particles in the form of neutrons or protons can collide randomly with silicon nuclei in the chip and fragment some of them, producing alpha-particles and other secondary particles, including the recoiling nucleus. These can travel in all directions with energies which can be quite high (though of course less than the incoming nucleon energy). Alpha-particle tracks so produced can sometimes extend a hundred microns through the silicon. The track of an ionizing particle may extend a fraction of a micron to many microns through the chip volume of interest, generating in its wake electron-hole pairs at a rate of one pair per 3.6-eV (electronvolts) loss of energy. A typical track might represent a million pairs of holes and electron.

Cosmic ray induced computer crashes have occurred and are expected to increase with frequency as devices (for example, transistors) decrease in size in chips. This problem is projected to become a major limiter of computer reliability in the next decade.

Various approaches have been suggested to eliminate or reduce the number of soft errors due to cosmic ray interactions in chips. None of these approaches is completely successful, particularly as device size continues to decrease.

Another approach is to accept that some soft errors will happen and to design memory and logic circuitry to include redundancy in all calculations. This approach involves more gates and enough spatial separation between contributing redundant elements to avoid mutual soft errors from the same cosmic ray. This approach is not practical for many chips.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

DETAILED DESCRIPTION

A. Examples of Chips and Systems

Figure 1:
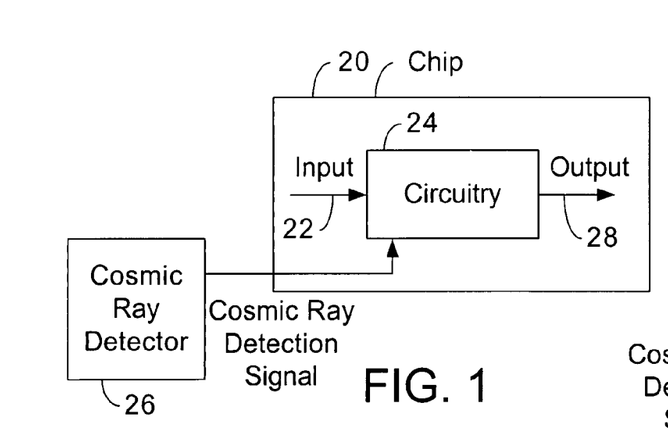
FIG. 1 is a schematic block diagram representation of a system including a chip having circuitry and a cosmic ray detector according to some embodiments of the inventions.

Referring to FIG. 1, a chip 20 includes circuitry 24 which receives input signals on conductors 22 and provides output signals to output conductors 28. Circuitry 24 may include any of a wide variety of circuits and may perform any of a wide variety of functions. A cosmic ray detector 26 detects at least some cosmic rays that enter chip 20. Cosmic ray detector 26 provides to circuitry 24 an indication of the detection of a cosmic ray. The cosmic ray detection signal may be indicated in various ways. For example, a cosmic ray detection signal may be a logical high voltage on a conductor from cosmic ray detector 26 to circuitry 24, while a logical low voltage on the same conductor does not indicate detection of cosmic rays, although this is not required. There may be additional circuitry that is not shown in FIG. 1 between cosmic ray detector 26 and circuitry 24. Accordingly, the cosmic ray detection signal might change its form, state, or other characteristic between cosmic ray detector 26 and circuitry 24. As used herein, the term "cosmic ray" is intended to be interpreted broadly to include various cosmic rays or particles that might change the voltage of signals in a chip.

In some embodiments, cosmic ray detector 26 indirectly detects a cosmic ray by detecting the effect of an interaction of the cosmic ray with the chip or chip package, but does not directly detect the cosmic ray itself. In other embodiments, cosmic ray detector 26 directly detects the cosmic ray. In some embodiments, cosmic ray detector 26 can both directly and indirectly detect a cosmic ray. It is expected that some detected cosmic rays will cause a soft error, while other detected cosmic rays will not cause a soft error. The cosmic ray detector 26 will not know whether the cosmic ray actually causes a soft error. It is also possible that some cosmic ray detectors might sometimes mistakenly identify a cosmic ray, and create a cosmic ray detection signal in response to the mistaken identity.

Depending on the embodiment, there are various ways in which circuitry 24 may respond to receiving a cosmic ray detection signal. For example, in some embodiments, circuitry 24 temporarily stops sending the output signals to conductors 28. Some or all of the signals internal to circuitry 24 are discarded and at least some of the input signals are again processed by circuitry 24. As explained below, in some embodiments, some internal signals are saved and reused rather than being discarded. After the input signals are reprocessed, the resulting output signals are provided to conductors 28. Output signals may be temporarily stopped by preventing a clock signal from clocking the output signal. In some embodiments, conductors 28 are temporarily placed in a high impedance state (also called a tri-state state), although this is not required.

In some embodiments, when a cosmic ray is detected, circuitry 24 restarts at an earlier state. This is a new variant of speculative execution, where the speculation is that no soft errors will happen. A bit value or bits may record a cosmic ray event in the vicinity of a logical processing unit during an operation of the chip. For many operations, it is sufficient to record the fact that a signal or signals were (potentially) subject to error, even after the operation is finished and results are in use by another logical entity.

Figure 2:
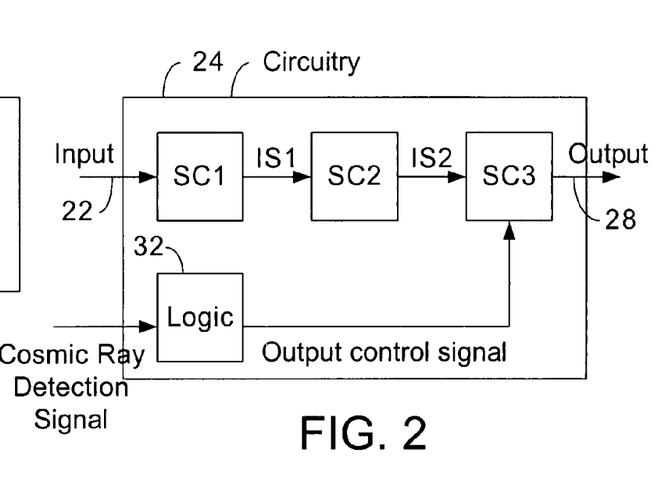
FIGS. 2 and 3 are each a schematic block diagram representation of the circuitry in the chip of FIG. 1 according to some embodiments of the inventions.

FIG. 2 provides an example of circuitry 24 of FIG. 1, although circuitry 24 is not required to include these details. In the example of FIG. 2, circuitry 24 includes subcircuits SC1, SC2, and SC3. The subcircuits may be any circuit from a very simple circuit up to a very extensive circuit involving millions of transistors. Subcircuit SC1 receives input signals and performs some operation on them to create internal signals IS1. Subcircuit SC2 receives internal signals IS1 and in response thereto creates internal signals IS2. Subcircuit SC3 is output circuitry that receives internal signals IS2 and selectively provides them as output signals to conductors 28. Subcircuit SC3 is selectively prevented from outputting the output signals through an output control signal from logic 32 (for example, by preventing a clock signal from clocking the output signal). Subcircuit SC3 may be a simple logic gate or be more complicated. The subcircuits may receive input and output signals in addition to those shown.

In operation, it is ordinarily the case that cosmic ray detector 26 does not detect cosmic rays and the cosmic ray detection signal is not applied to logic 32 of circuitry 24. When the cosmic ray detection signal is not received, logic 32 does not cause subcircuit SC3 to block signals IS2 from passing to output conductors 28 because of a detected cosmic ray (although there may be another reason why logic 32 may prevent output signals). On the other hand, when the cosmic ray detection signal is received, logic 32 causes the output control signal to temporarily cause subcircuit SC3 to not pass internal signals IS2. In some embodiments, subcircuit SC3 is not re-enabled until IS2 is proper for it to be output.

Figure 3:
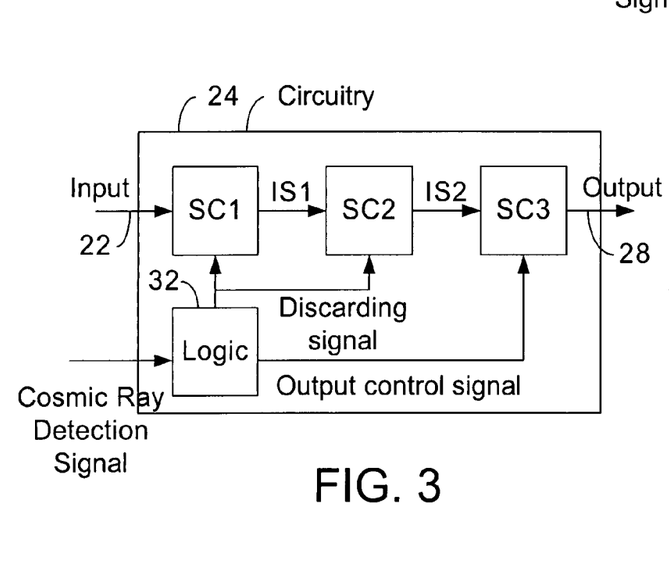

In FIG. 2, internal signals in subcircuits SC1 and SC2 may be discarded merely by having them be changed as new inputs are applied. Alternatively, as shown in FIG. 3, logic 32 may provide discarding signals to SC1 and SC2 to cause the internal signals to be discarded.

In some embodiments, logic 32 can also cause at least some of the input signals to be reapplied to circuitry 24 or to some of the subcircuits. This may cause circuitry 24 to operate on a previous state of signals.

In some embodiments, the input signals are stored in temporary storage and are reapplied to circuitry 24 from the temporary storage, although such temporary storage is not included in all embodiments. In some embodiments, some internal signals are also stored in temporary storage for reuse. In these embodiments, the combination of certain input signals and internal signals may constitute the earlier state. As an example, logic 32 can direct circuitry 24 to read from the temporary storage.

Figure 4:
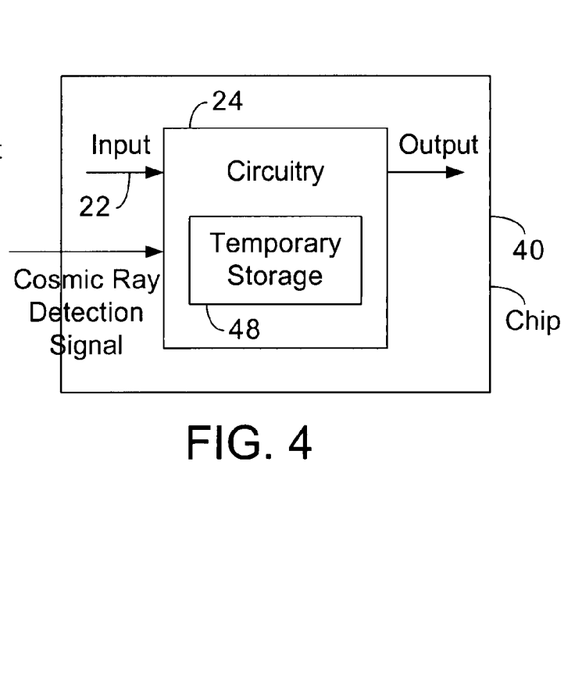
FIGS. 4 and 5 are each a schematic block diagram representation of a chip according to some embodiments of the inventions.
Figure 5:
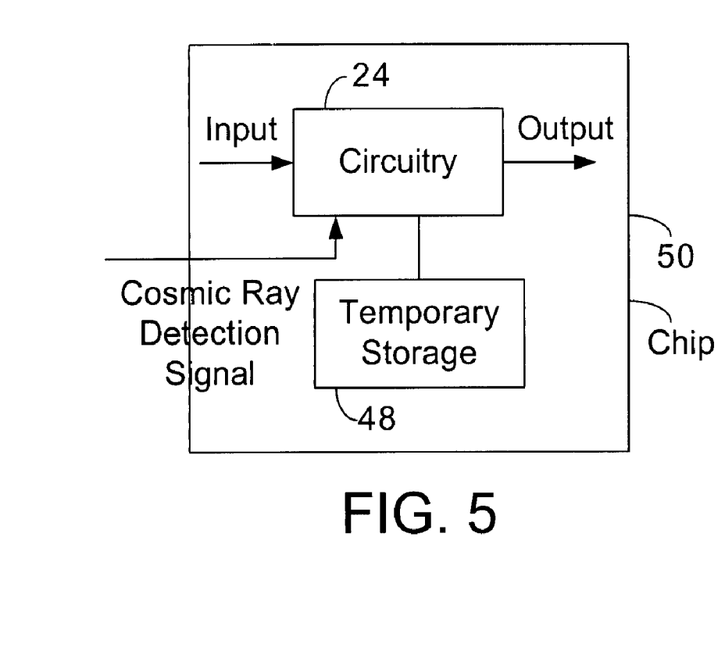
Figure 6:
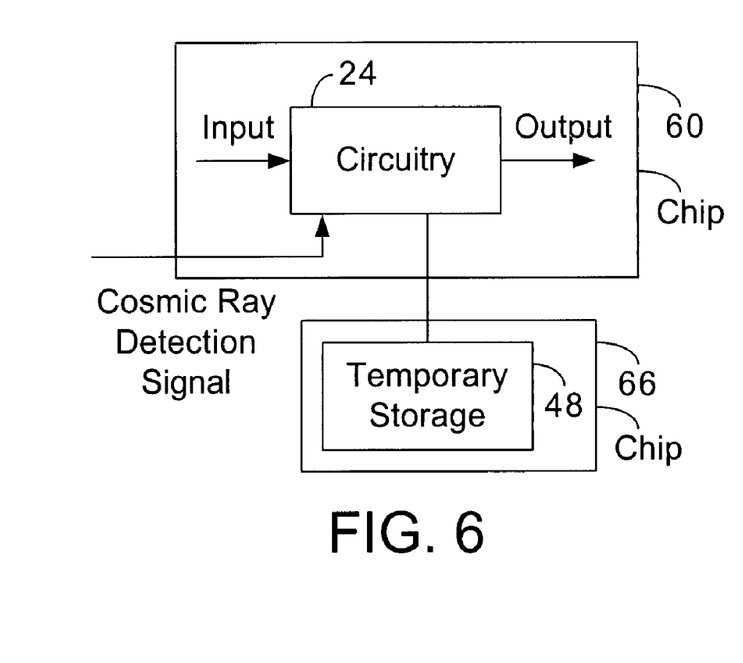
FIG. 6 is a system with two chips according to some embodiments of the inventions.

FIG. 4 shows a chip 40 with temporary storage 48 as part of circuitry 24. Temporary storage 48 may include registers, SRAM, DRAM, Flash, or other types of memory. FIG. 5 shows a chip 50 in which temporary storage 48 is more removed from circuitry 24, but still in the same chip as circuitry 24. An advantage to having the temporary storage be removed from circuitry 24 is that if a cosmic ray hits circuitry 24, it is less likely to also effect temporary storage 48 if temporary storage 48 is spatially separated from circuitry 24. FIG. 6 illustrates chips 60 that includes circuitry 24 and another chip 66 that holds temporary storage 48. There may be additional circuitry that is not shown in FIG. 6 that is between temporary storage 48 and circuitry 24.

Figure 7:
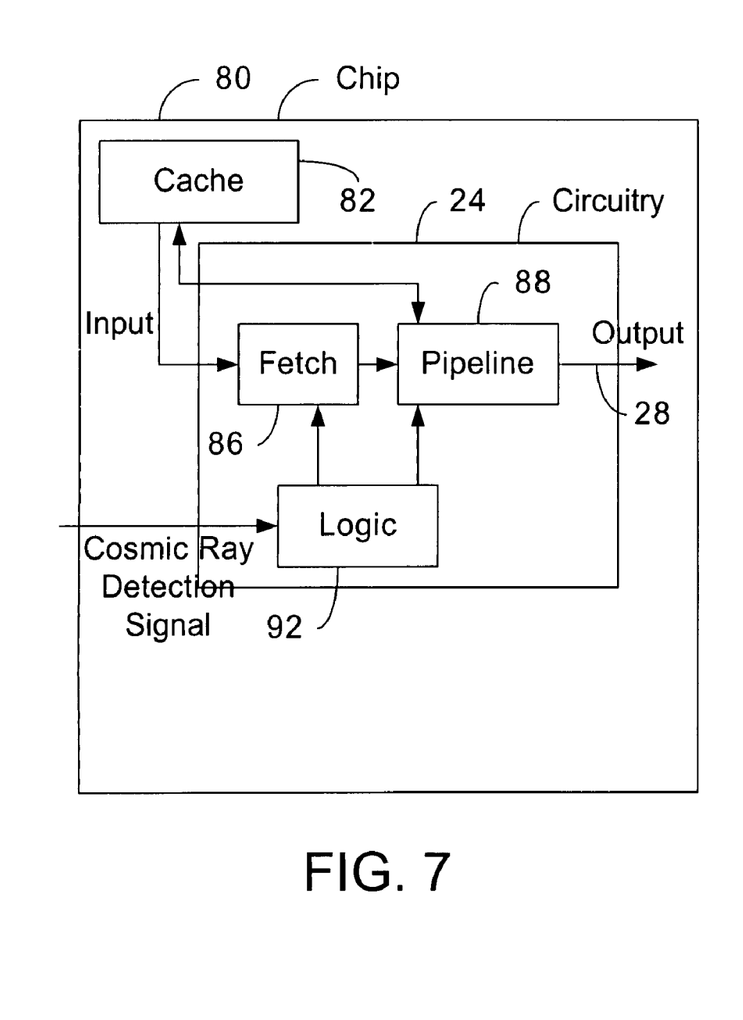
FIGS. 7 and 8 are each a schematic block diagram representation of a chip according to some embodiments of the inventions.

As an example, FIG. 7 illustrates a chip 80 that includes circuitry 24 that receives data and instructions from a cache 82. Cache 82 may represent multiple caches. As shown in FIG. 7, circuitry 24 includes fetch circuitry 86, a pipeline 88, and logic 92, although these elements are not required in all embodiments. In ordinary operation, fetch circuitry 86 fetches instructions from cache 82. Pipeline 88 performs at least some of the fetched instructions. Data from cache 82 can be provided to pipeline 88 directly or through fetch circuitry 86. When a cosmic ray is detected, a cosmic ray detection signal is received by logic 92, which may be the same as or similar to logic 32 in FIG. 2. In the example of FIG. 7, logic 92 causes all or part of pipeline 88 to be flushed and temporarily prevents the outputting of data to conductors 28. Logic 92 causes fetch circuitry 86 to re-fetch the instructions for pipeline 88. Pipeline 88 can also retrieve data from cache 82 as needed. In this way, if an error is introduced into some of the data or instructions in pipeline 88 because of the cosmic ray, the instructions can be re-executed along with the data.

Figure 8:
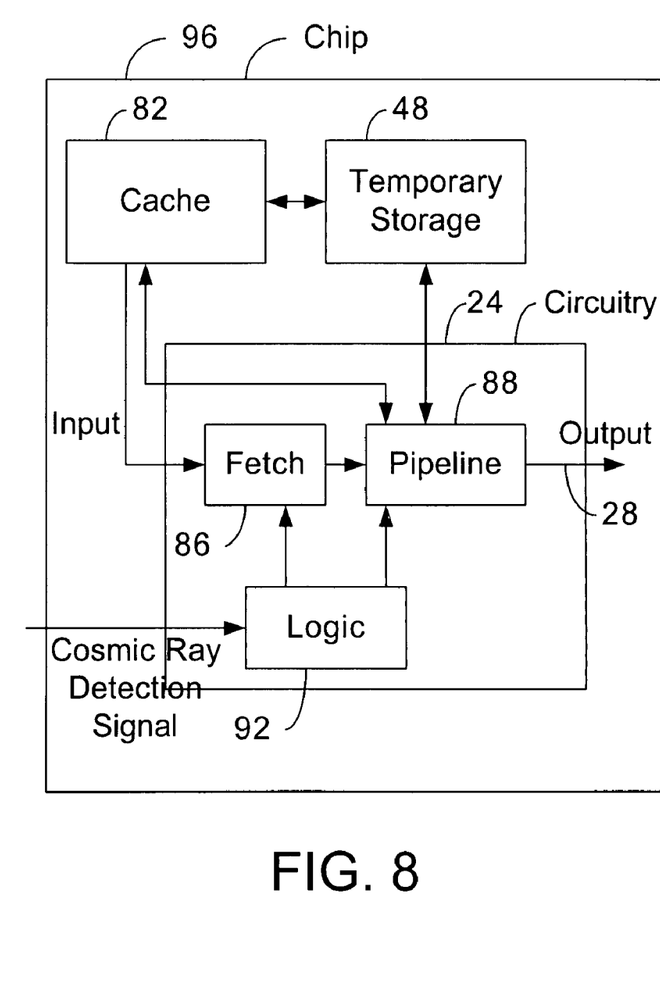

FIG. 8 is similar to FIG. 7 except that chip 96 in FIG. 8 includes temporary storage 48 that holds data to be used by pipeline 88 in the event of a cosmic ray detection. As pipeline 88 is processing instructions and data, it may generate internal data that can be stored in temporary storage 48 and in some embodiments also in cache 82. When a cosmic ray detection signal is detected by logic 92, logic 92 can cause pipeline 88 to retrieve at least some of the data from temporary storage 48 as needed. In some embodiments, some data from cache 82 can also be stored in temporary storage 48. In some embodiments, temporary storage 48 also holds at least some instructions and data from cache 82. There may be error detection techniques used to see if data has errors, but this is not required.

Of course, each of the chips shown or described may have various memory that is not illustrated in the figures and that temporarily stores various data that might not be used in re-execution in response to a cosmic ray detection. Some memory may hold some signals that are used in re-execution and other signals that are not used in re-execution.

Figure 9:
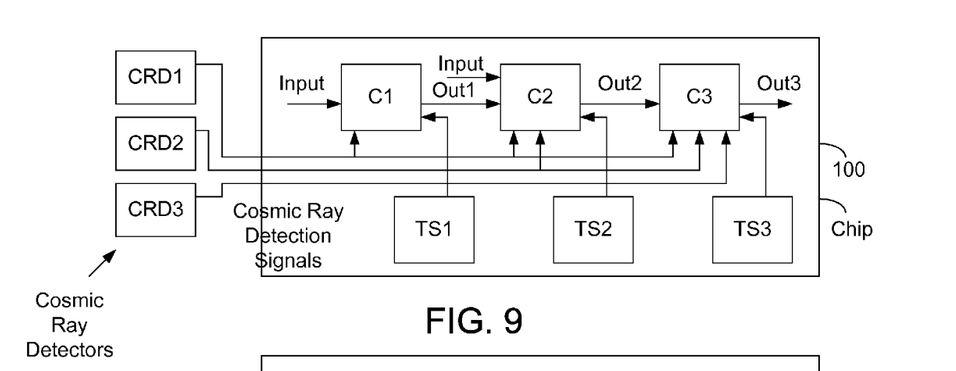
FIGS. 9 and 10 are each a schematic block diagram representation of a system including a chip and three cosmic ray detectors according to some embodiments of the inventions.

FIG. 9 illustrates a chip 100 that includes circuitry C1, circuitry C2, and circuitry C3, with associated temporary storage TS1, TS2, and TS3. Circuitry C1 provides output signals Out1. Circuitry C2 and C3 have input signals which are Out1 and Out2 respectively, and output signals Out2 and Out3 respectively. The circuitry may also have other input signals (see, for example, those shown being input into circuitry C2) and other output signals (not shown). Logic similar to logic 32 or 82 may be included. Three cosmic ray detectors CRD1, CRD2, and CRD3 are in different locations. In some embodiments, CRD1 is closest to circuitry C1, CRD2 is closest to circuitry C2, and CRD3 is closest to circuitry C3.

Figure 10:
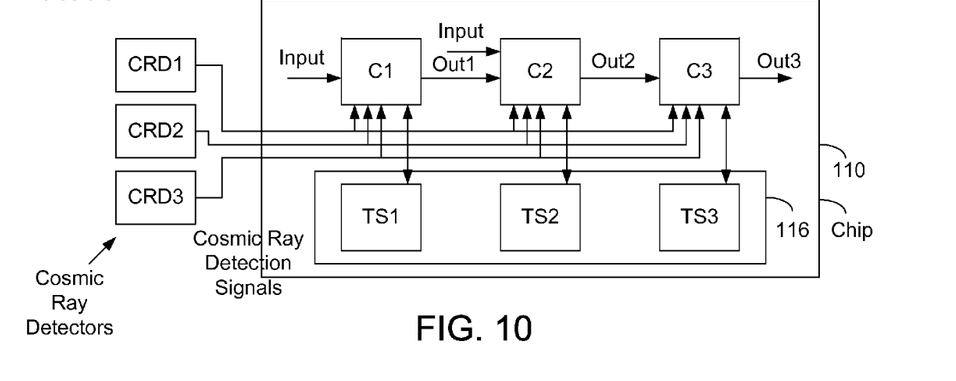
Figure 12:
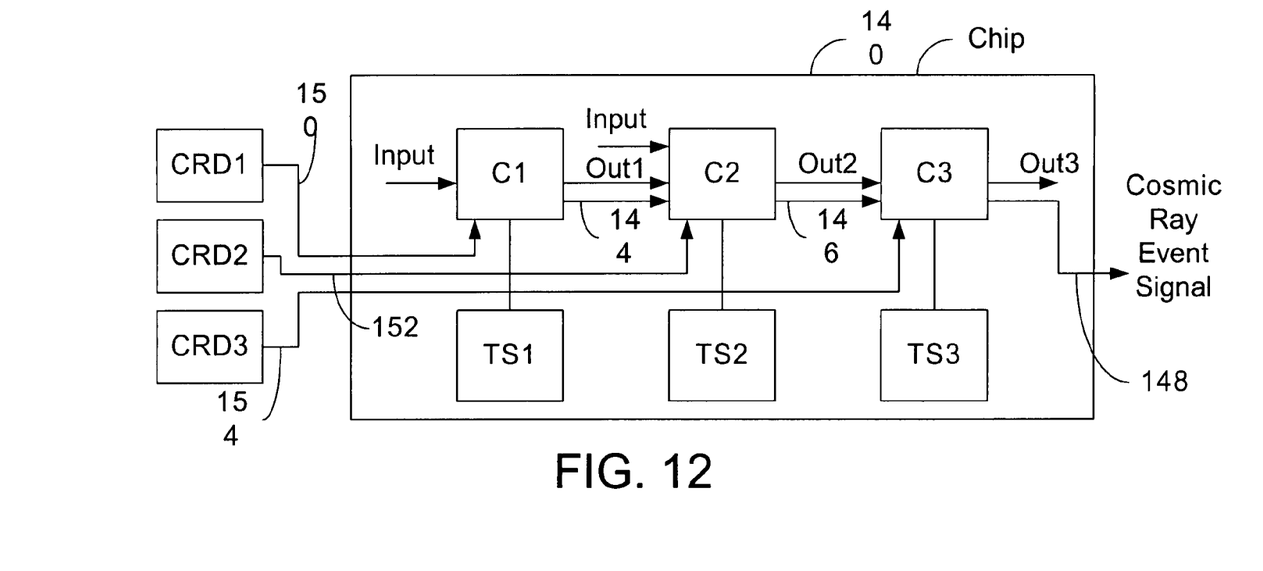
FIG. 12 is a schematic block diagram representation of a system including a chip and three cosmic ray detectors according to some embodiments of the inventions.

In FIG. 10, chip 110 is similar to chip 100 of FIG. 9. One difference between chip 100 and chip 110 is that temporary storage TS1, TS2, and TS3 in chip 110 are combined in memory structure 116. By contrast, in FIG. 9, TS1, TS2, and TS3 are spatially separated. Another difference is that in chip 110 each of CRD1, CRD2, and CRD3 provide a cosmic ray detection signal to each of the circuitry C1, C2, and C3. A reason to do this is that some cosmic ray detectors detect a cosmic ray from any where in the chip or from a fairly large volume of the chip. Accordingly, more than one detector may detect a particular cosmic ray. It might not be clear which cosmic ray detector is closest to the cosmic ray interaction. In this case, it may be safest to have all the circuitry notified of the event. If the cosmic ray detectors detect interactions that are only at or very close to the detectors, then it might be appropriate to have each of CRD1, CRD2, and CRD3 provides a cosmic ray detection signal to only one of the circuitries. More complicated circuitry might be used to determine more precisely where the cosmic ray interaction happens. For example, some triangulation or timing circuitry might be used, but that is not required. In FIG. 9, the cosmic ray detection signals are provided to all upstream circuitries. In FIG. 12, the cosmic ray detection signals are applied to only one circuitry each.

Merely as an example, cache 82 in FIG. 8 may be C1 in FIG. 10 with temporary storage 48 being included in memory 116. FIG. 8 could have different temporary storages for cache 82 and pipeline 88 such as shown in FIG. 9.

Figure 11:
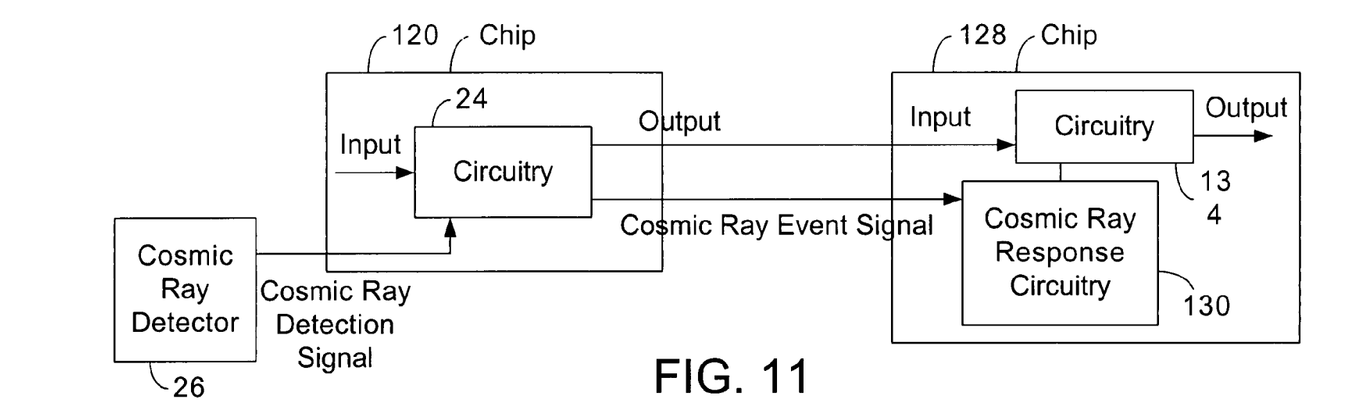
FIG. 11 is a schematic block diagram representation of a system including chips and a cosmic ray detector according to some embodiments of the inventions.

FIG. 11 illustrates chips 120 and 128. Circuitry 24 provides an output signal to circuitry 134 of chip 128. In addition, circuitry 24 selectively provides a cosmic ray event signal to cosmic ray response circuitry 130 of chip 128. The cosmic ray event signal indicates that a cosmic ray has been detected and it may have led to potential error in the output signal from circuitry 24. Cosmic ray response circuitry 130 decides what to do about the potential error in the output signal from chip 120. For example, in some embodiments, cosmic ray response circuitry 130 causes circuitry 134 to ignore the input signals and wait for a new (reprocessed) output signals from chip 120. Circuitry 130 may request chip 120 to reprocess and send another output signal. In other embodiments, cosmic ray response circuitry 130 may allow circuitry 134 to accept the input signals if various tests on the input signals are successful and otherwise ignore the input signals and wait for new input signals.

Figure 24:
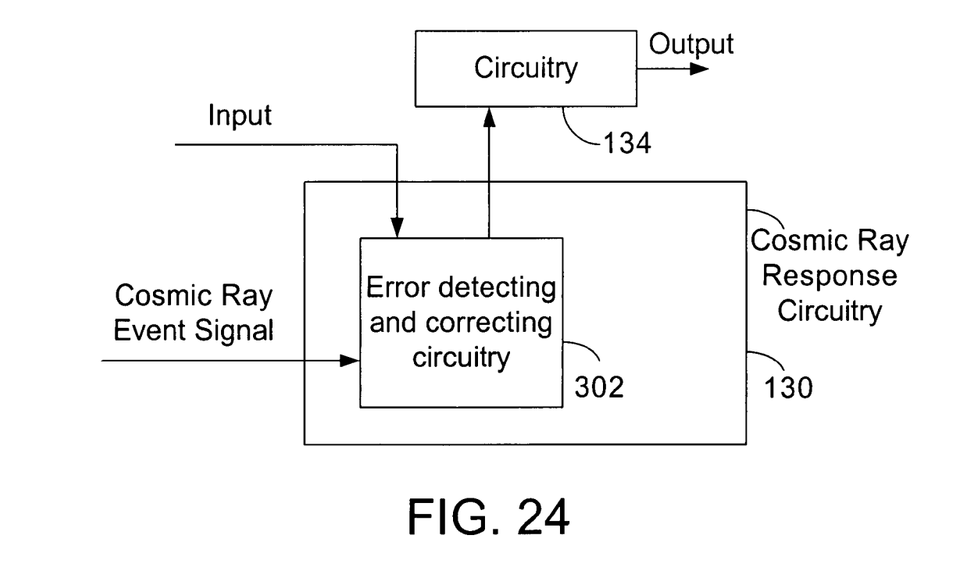
FIGS. 24 and 25 are each a schematic block diagram representation of circuits that may be used according to some embodiments of the inventions.
Figure 25:
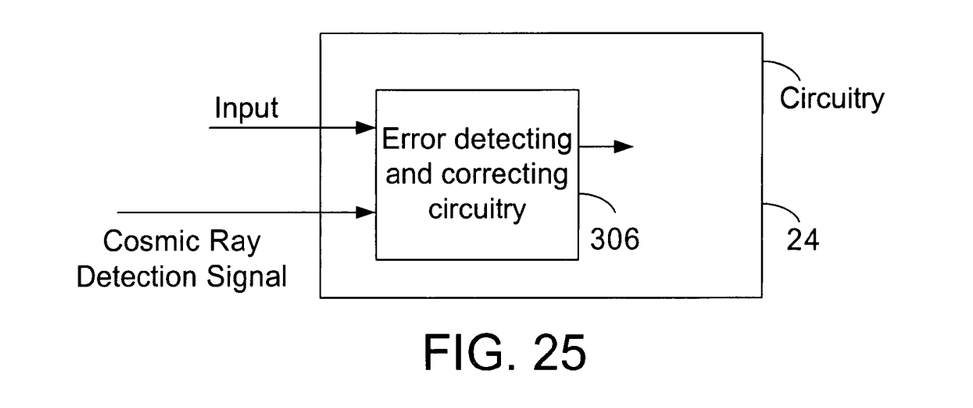

Referring to FIG. 24, cosmic ray response circuitry 130 in FIG. 11 may include error detecting and correcting circuitry 302 to detect errors in the output signals and correct them. The errors may be the soft errors or other errors caused by the soft errors. If there is no cosmic ray event signal (or if it is not asserted), then the input signals (which are output from chip 120) may pass through to circuitry 134. If there is a cosmic ray event signal, errors may be detected, if possible, and corrected, if possible. Referring to FIG. 25, circuitry 24 and (the circuitry) may include error detecting and correcting circuitry 306. In this respect, rather than reprocess signals, the response may be to detect and correct errors. Of course, in many cases, detecting and/or correcting the error might not be possible and reprocessing is the appropriate response to detecting a cosmic ray. Accordingly, in some embodiments, circuitry 24 and 130 do not have error detection or error correction circuitry.

There may be additional circuitry (not shown) between circuitry 24 and circuitry 134 and additional circuitry (not shown) between circuitry 24 and cosmic ray response circuitry 130. Accordingly, the output signal and cosmic ray event signal may change form, state, or other characteristic. Further, the output signals and cosmic ray event signals may be time multiplexed or packetized on the same conductors in parallel or serial form.

FIG. 12 shows details of a chip 140 according to some embodiments of the invention, but other embodiments do not include these details. Referring to FIG. 12, chip 140 is similar to chip 100 of FIG. 9. However, circuit C3 selectively provides a cosmic ray event signal on conductor(s) 148. The cosmic ray event signal indicates that a cosmic ray has been detected in association with chip 140. Chip 140 also includes conductor(s) 144 which provides a cosmic ray event signal from circuit C1 to C2 and conductor(s) 146 which provides a cosmic ray event signal from circuit C2 to C3. In some embodiments, the cosmic ray event signal on conductor(s) 144 comes directly from conductor(s) 150 and in other embodiments, it is indirect. In some embodiments, the cosmic ray event signal on conductor(s) 146 comes directly from conductor(s) 144 or 152 and in other embodiments, it is indirect. In some embodiments, the cosmic ray event signal on conductor(s) 148 comes directly from conductor(s) 146 or 154 and in other embodiments, it is indirect.

Figure 13:
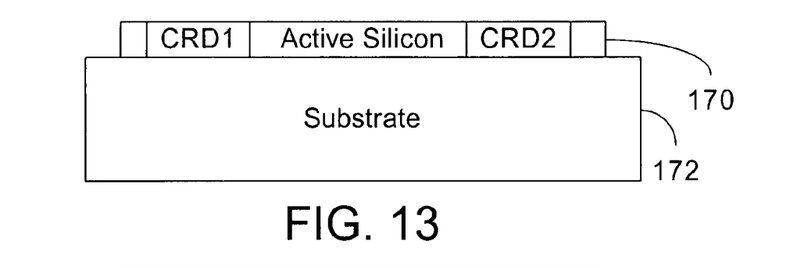
FIGS. 13 and 14 are each a schematic block diagram representation of a cross-sectional side view of a chip including two cosmic ray detectors according to some embodiments of the inventions.
Figure 14:
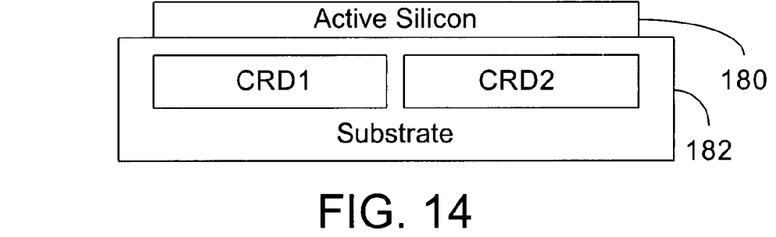
Figure 15:
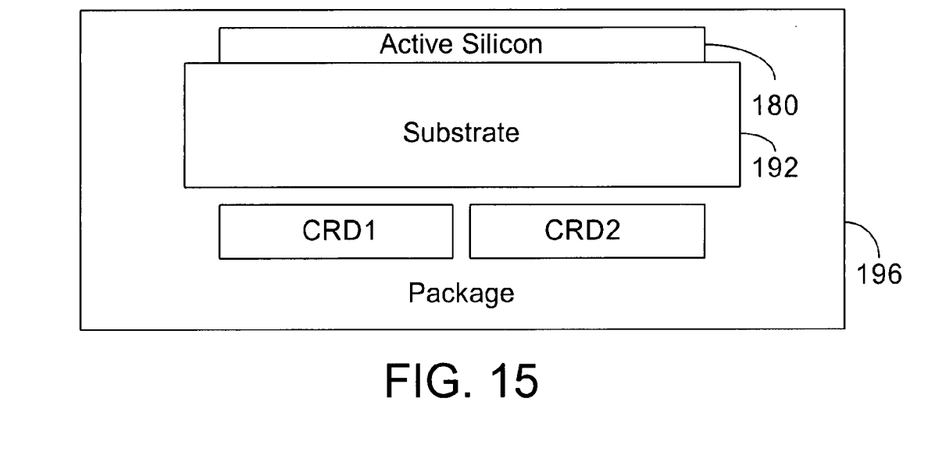
FIG. 15 is a schematic block diagram representation of a cross-sectional side view of a chip and a package including two cosmic ray detectors according to some embodiments of the inventions.

In different embodiments, the cosmic ray detectors may be placed in different positions. For example, FIG. 13 illustrates a chip with active silicon region 170 on a substrate 172 (which may also be silicon). The cosmic ray detectors CRD1 and CRD2 are formed into the active region of the silicon. In FIG. 14, cosmic ray detectors CRD1 and CRD2 are formed in a substrate 182, which supports an active silicon region 180. In FIG. 15, cosmic ray detectors CRD1 and CRD2 are formed into a package 196 supporting substrate 192 on which is formed an active silicon region 180. The inventions are not restricted to these details. The chips of FIGS. 13-19 and 21 may be flipped (for example, in a flipped-chip arrangement). In FIG. 15, the CRD1 and CRD2 may be put on the other side of active silicon 180. This is, FIG. 15 could be changed so CRD1 and CRD2 are above active silicon 204 rather than below it as shown in FIG. 15 (where "above" and "below" are not necessarily gravitational orientations).

In some embodiments, there is only one cosmic ray detector for a chip and in other embodiments there may be more than one detector, including many detectors.

The cosmic ray detectors may be bigger or smaller than are shown in the figures with respect to the relative size of the chip. Indeed, all the figures are schematic in nature and not intended to show actual or relative sizes of components in the figures.

In different embodiments, the cosmic ray detectors are at different orientations with respect to the top and bottom surfaces of the chip. The cosmic ray detectors may be parallel with or perpendicular to the top and bottom surfaces or they may be at other angles with respect to them.

The chips described herein may be fabricated on silicon substrates or be other types of chips such as gallium arsenide chips. Various types of fabrication processors may be used. As fabrication techniques evolve, the chips may have characteristics different than illustrated, yet the principles of the inventions will still apply.

B. Cosmic Ray Detectors

Various types of cosmic ray detectors may be used including those that are currently available and those yet to be made. Current integrated circuit chips have a top layer of silicon that contains all the active elements and is perhaps only one micron in thickness. As we progress into nanotechnology, the working thicknesses will likely drop. A cosmic ray that causes soft errors may result in a silicon nucleus splitting apart and create a trial of ionizing debris over a track on the order of a hundred microns long. The next energy released may be several millon electron volts and the final products may be several million electron-hole pairs with a typical energy of several electron volts for each particle. Various types of cosmic ray detectors may detect these electron-hole pairs.

In different embodiments, a cosmic ray detector may include electrical, optical, mechanical, or acoustic components, or a combination of one or more of electrical, optical, mechanical, or acoustic components. In some embodiments, the cosmic ray detectors may include components that are not electrical, optical, mechanical, or acoustic components.

In some embodiments, the cosmic ray detector detects the debris tract of a cosmic ray. In some embodiments, the cosmic ray detector includes large, distributed P-N junctions to gather charge. In some embodiments, the cosmic ray detector includes optical cosmic ray detectors embedded into some optically clear supporting insulator such as diamond thermal spreaders. For example, one million electron-hole pairs may create a large number of recombination photons. In some embodiments, a scintillator panel (which gives off small flashes of light (photons) when a charge particle passes through it), a light guide to direct light from the scintillator, and photon detectors may be used.

In some embodiments, the cosmic ray detectors include an array of micro-electro-mechanical systems (MEMS). MEMS cosmic ray detectors may be an integration of mechanical elements, sensors, actuators, and electronics on a very small scale. The cosmic ray detectors may include tips or other strain detectors to detect the shockwave from the nuclear collision by means of acoustic waves propagating through the substrate.

It is understood that when a cosmic ray fragments a silicon nucleus, about 10 MeV (mega electronvolts) or 1 pj (picojoules) of energy is released in less than 1 nanosecond. After the electrons and holes recombine the net cosmic ray energy appears in the form of local heating or a cloud of phonons spreading out from the impact site. Assuming recombination happens within a nanosecond or so and given the speed of phonons in a lattice of around 10 km/s (kilometers/second), we see that the cosmic ray has transformed into an intense sound wave with a wavefront that may be on the order of 0.01 mm (millimeter) thick. At a distance of 5 mm from the source of the sound, this waveform may produce a peak acoustic power density of 0.3 mW/cm$^{-2}$ (milliwatts/centimeter squared). Over an aperture of a wavelength squared, a peak power of 0.3 nW (nanowatts) may be received. For the gigahertz bandwidth of this signal (1/ns) (nanosecond) thermal noise may be about $10^{-11}$ watts. Thus, there may be a very large signal to noise for this waveform. There may be other sources of noise due to circuit switching but the signature of this form of heating should be very different. Note that the actual numbers may vary in particular examples.

By incorporating a very sensitive strain cosmic ray detector into a cantilever it is possible to build high speed acoustic cosmic ray detectors. One possibility is to incorporate a Scanning Tunneling Microscope, STM, structure into a cantilever. STM structures can detect displacements as small as $1/10,000^{th}$ of an atomic diameter. In some embodiments, the cosmic ray detector includes a very small cantilever that will not respond to slow acoustic waves. If the cantilever is on the order of 0.01 mm long, then it may optimally respond to the abrupt waveform of the cosmic ray event. Much larger or smaller cantilevers may tend to ignore this size of disturbance. However, desirable lengths of cantilevers may vary depending on various factors. The stiffness or other properties of the cantilever may effect a desirable length and may be chosen to achieve desired movement. The first resonance or response frequency of the cantilever may be matched to the dominant frequencies expected from a cosmic ray. (Of course, in some embodiments, the cosmic ray detectors does not include a cantilever.) In some embodiments, the cosmic ray detector or detectors include one or more MEMS structures that are tuned to the expected acoustic waveform from a cosmic ray event. STM structure tips can provide extremely sensitive strain detection of sound waves.

The entire event may release its energy in less than one nanosecond. Thus, a soft error bit or bits might be able to be set before calculation has progressed very far. The soft error bit or bits, if used, may be in logic 32 and logic 82.

Figure 16:
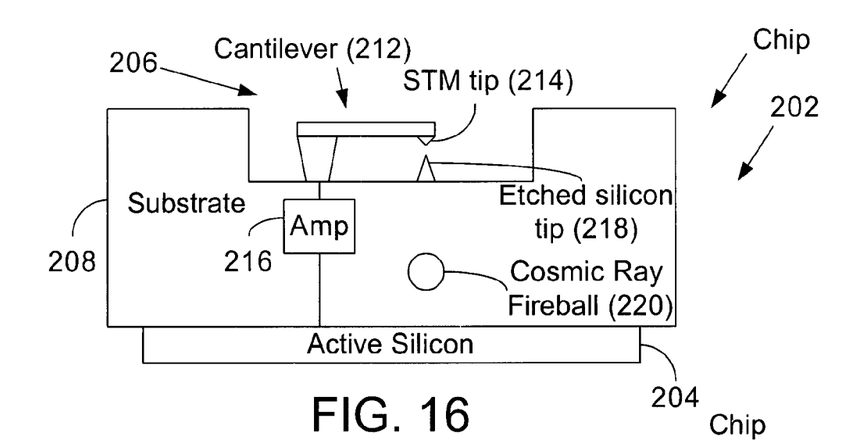
FIGS. 16, 17, and 18 are each a schematic block diagram representation of a cross-sectional side view of a chip including a cosmic ray detector according to some embodiments of the inventions.

FIG. 16 illustrates a chip 202 with a cosmic ray detector 206 including a cantilever 212, an STM structure tip 204 and a etched silicon tip 218. A cosmic ray fireball 220 represents an interaction between a cosmic ray and silicon in substrate 208 near active silicon 204. In response to the interaction, a wave causes the distance between STM structure tip 214 and tip 218 to change. This change is detected and interpreted as being caused by a cosmic ray. An optional amplifier 216 is shown between cosmic ray detector 206 and active silicon 204. In practice, amplifier 216 may be part of cosmic ray detector 206, part of active silicon 204, or between them. Amplifier 216 and cosmic ray fireball 220 are not shown in other figures to avoid clutter.

Figure 17:
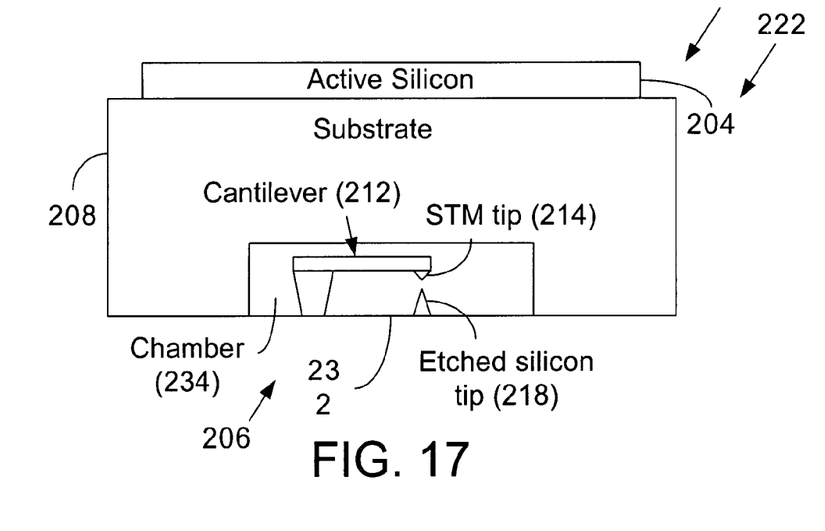

FIG. 17 illustrates a chip 222 that is like chip 202 in FIG. 16 except that the chip is flipped in orientation so that cosmic ray detector 206 is in a chamber 234 supported by a support 232.

Figure 18:
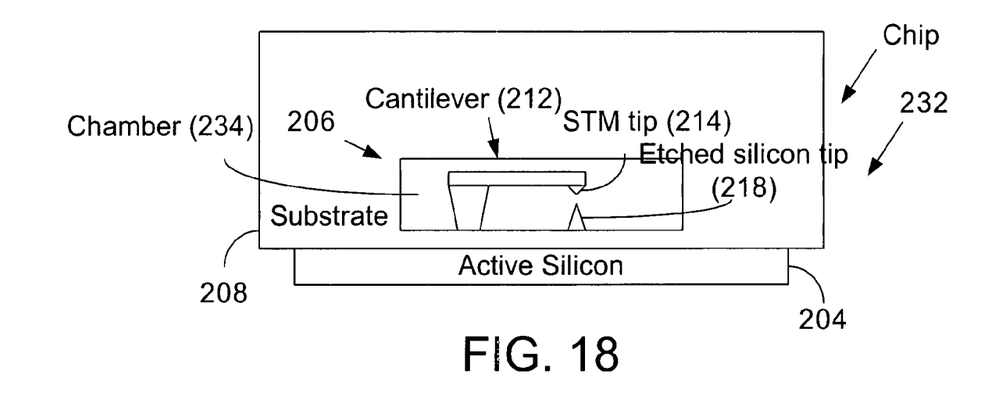

FIG. 18 illustrates a chip 232 that is like chip 222 in FIG. 17 except that the chamber 234 is closer to active silicon 204 than is shown in FIG. 17.

Figure 19:
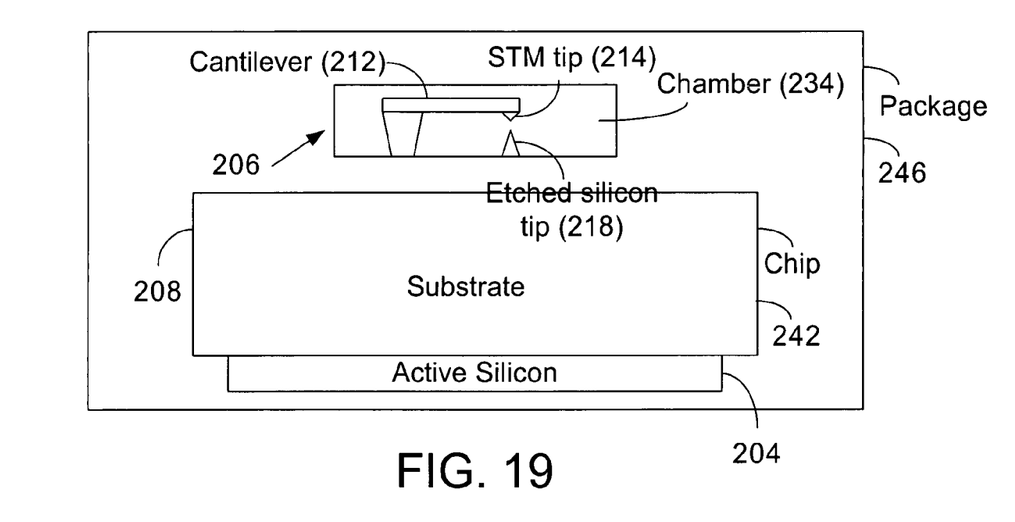
FIG. 19 is a schematic block diagram representation of a cross-sectional side view of a chip and a package including a cosmic ray detector according to some embodiments of the inventions.

FIG. 19 illustrates a chip 242 and chamber 234 being in a package 246. Cosmic ray detector 206 may be put on the other side of active silicon 204. This is, FIG. 19 could be changed so cosmic ray detector 206 is below active silicon 204 rather than above it as shown in FIG. 19 (where "above" and "below" are not necessarily gravitational orientations).

Figure 20:
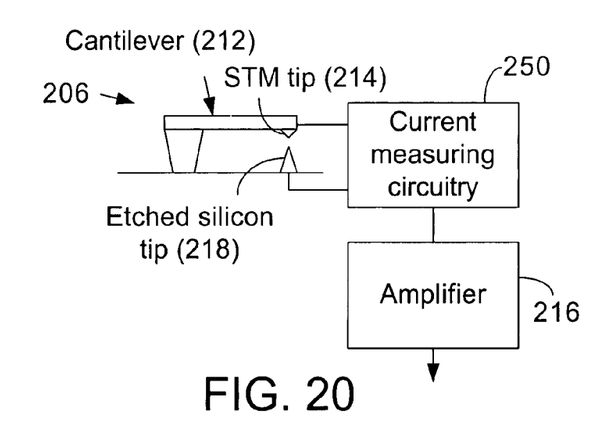
FIG. 20 is a schematic block diagram representation of a cosmic ray detector, current measuring circuitry, and an amplifier accordingly to some embodiments of the inventions.

FIG. 20 illustrates a current measuring circuitry 250 which is included in some embodiments of cosmic ray detector 206, but is not required in all embodiments. Current measuring circuitry 250 detects changes in the current between tips 214 and 218, which can change as the distance between the tips change. In some embodiments, current measuring circuitry 250 detects sudden changes in current and provides a signal to amplifier 216 in response thereto. In other embodiments, current measuring circuitry 250 detects when the current goes above or below certain threshold amounts. Other possibilities exist.

Figure 21:
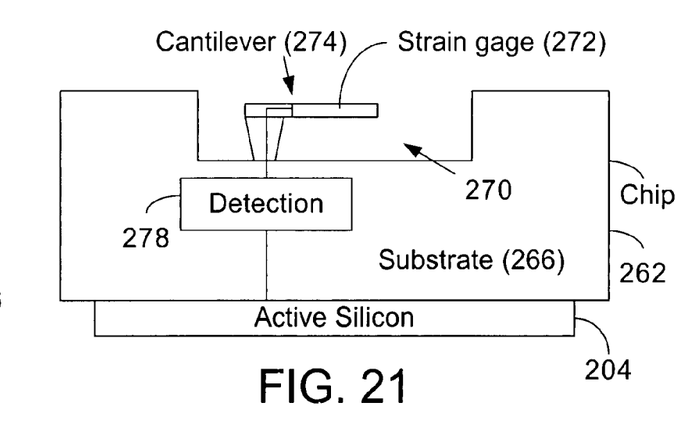
FIG. 21 is a schematic block diagram representation of a cross-sectional side view of a chip including a cosmic ray detector according to some embodiments of the inventions.

FIG. 21 illustrates a chip 262 with a cosmic ray detector 270 with a cantilever 274 and a strain gage 272. In response to a cosmic ray interaction event, strain gage 272 bends. Bend detection circuitry 278 determines whether a bend of strain gage 272 is of the type that would be caused by a cosmic ray interaction event. There may also be an amplifier. Although bend detection circuitry 278 is illustrated in substrate 266, it may be next to the cantilever, in active silicon 204 or in substrate 266. Cosmic ray detector 270 may be in other places, for example as shown in FIGS. 17-19.

Figure 22:
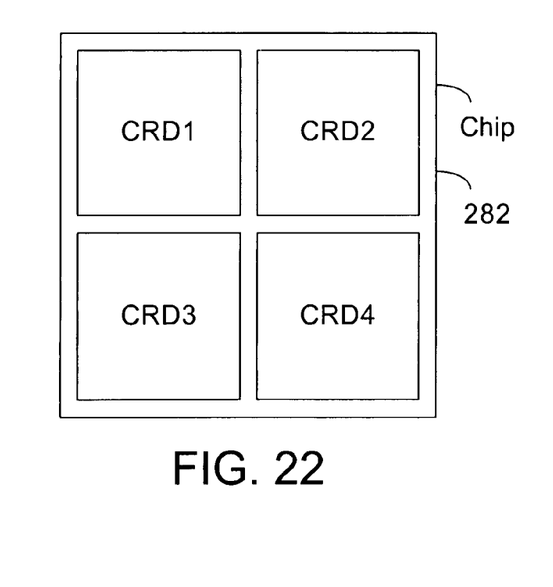
FIGS. 22 and 23 are each a schematic block diagram representation of a chip associated with cosmic ray detectors according to some embodiments of the inventions.
Figure 23:
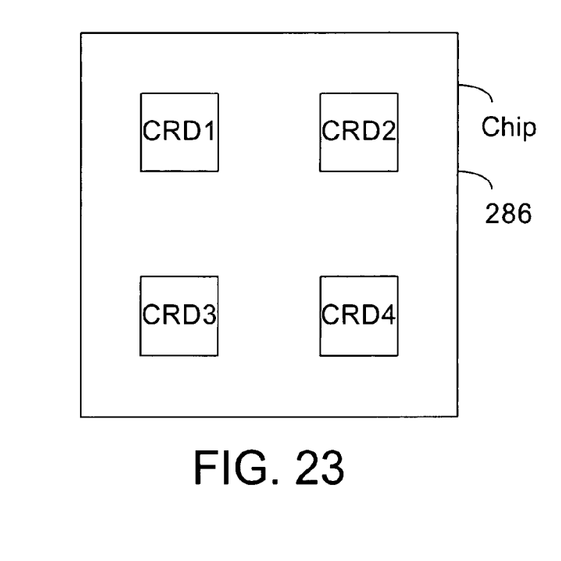

FIGS. 22 and 23 illustrate chips 282 and 286 associated with cosmic ray detectors CRD1, CRD2, and CRD3. The cosmic ray detectors are smaller in FIG. 23 than in FIG. 22. The cosmic ray detectors may actually bigger or smaller than shown relative to the size of the chip. If the detectors are small enough, they may be economically placed in the active silicon. The cosmic ray detectors may be in, above, or below the active silicon or be in the package. As noted, some cosmic ray detectors can detector cosmic interaction events from a significant distance from the cosmic ray detector. More or less than four detectors may be used. The cosmic ray detectors in FIGS. 22 and 23 may represent any of the cosmic detectors described or illustrated including those having cantilevers, those having distributed P-N junctions to gather charge, and those having photo-detectors.

In different embodiments, the cosmic ray detectors are at different orientations with respect to the top and bottom surfaces of the chip. The cosmic ray detectors may be parallel with or perpendicular to the top and bottom surfaces or they may be at other angles with respect to them.

C. Additional Information

The various numbers and details provided above regarding cosmic ray interactions and detections are believed to be correct, but may be only approximate or mistaken for various reasons. However, the principles of the inventions will still apply.

In FIGS. 13-19 and 22, the active silicon region is illustrated as not going over the entire substrate. However, the active silicon region could extend over the entire substrate or over more or less than is shown in the figures.

The cosmic ray detectors could be wirelessly coupled to the chips.

If the term "first circuitry" is used in the claims, it does not necessarily apply that there is secondary circuitry, although there might be.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The inventions are not restricted to the particular details described herein. Indeed, many other variations of the foregoing description and drawings may be made within the scope of the present inventions. Accordingly, it is the following claims including any amendments thereto that define the scope of the inventions.

What is claimed is:

1. A chip comprising:
   an active region including first circuitry;
   a substrate supporting the active region; and
   a first cosmic ray detector, wherein the first cosmic ray detector is a micro-electro-mechanical systems (MEMS) cosmic ray detector.

2. The chip of claim 1, wherein the first cosmic ray detector is in the active region.

3. The chip of claim 1, wherein the first cosmic ray detector is in the substrate.

4. The chip of claim 1, wherein the first cosmic ray detector provides a cosmic ray detection signal to be received by the first circuitry.

5. The chip of claim 1, wherein the first cosmic ray detector includes:
   a cantilever with a first tip;
   a second tip; and
   circuitry to provide a signal indicative of a distance between the first and second tips being such as would be caused by a cosmic ray interaction event.

6. The chip of claim 5, wherein the first tip is a scanning tunnel microscope structure tip.

7. The chip of claim 5, wherein the circuitry to provide a signal is a current measuring circuitry to measure current between the first and second tips.

8. The chip of claim 1, wherein the first cosmic ray detector provides first cosmic ray detection signals and wherein the chip further comprises second circuitry and a second cosmic ray detector to provide second cosmic ray detection signals.

9. The chip of claim 8, wherein the first and second circuitry receive the first and second cosmic ray detection signals, respectively.

10. A system comprising:
    a first chip comprising:
    an active region including first circuitry;
    a substrate supporting the active region; and
    a package to package the chip, wherein the package includes a first cosmic ray detector, wherein the first cosmic ray detector is a micro-electro-mechanical systems (MEMS) cosmic ray detector.

11. The system of claim 10, wherein the first cosmic ray detector provides a cosmic ray detection signal to be received by the first circuitry.

12. The system of claim 10, wherein the first cosmic ray detector includes:
- a cantilever with a first tip;
- a second tip; and
- circuitry to provide a signal indicative of a distance between the first and second tips being such as would be caused by a cosmic ray interaction event.

13. The system of claim 12, wherein the first tip is a scanning tunnel microscope structure tip.

14. The system of claim 12, wherein the circuitry to provide a signal is a current measuring circuitry to measure current between the first and second tips.

15. The system of claim 10, wherein the active region further includes second circuitry, and wherein the package further includes a second cosmic ray detector, and wherein the first and second cosmic ray detectors provide first and second cosmic ray detection signals to be received by the first and second circuitry, respectively.

16. The chip of claim 15, wherein the first and second cosmic ray detectors are formed in the active region.

17. The chip of claim 15, wherein the first and second cosmic ray detectors are formed in the substrate.

18. A chip comprising:
- an active region including first circuitry and second circuitry;
- a substrate supporting the active region; and
- a first cosmic ray detector to provide first cosmic ray detector signals to be received by the first circuitry, and a second cosmic ray detector to provide second cosmic ray detector signals to be received by the second circuitry.

* * * * *